United States Patent [19]
Beyea et al.

[11] Patent Number: 6,055,258
[45] Date of Patent: Apr. 25, 2000

[54] LASER DIODE WITH AN ION-IMPLANTED REGION

[75] Inventors: Dana M. Beyea, Londonderry, N.H.; Todd Martin Dixon, Littleton; Edward M. Clausen, Jr., Franklin, both of Mass.

[73] Assignee: Polaroid Corporation, Cambridge, Mass.

[21] Appl. No.: 09/148,376

[22] Filed: Sep. 4, 1998

Related U.S. Application Data

[63] Continuation of application No. 08/561,054, Nov. 22, 1995, Pat. No. 5,804,461.

[51] Int. Cl.$^7$ ...................................................... F21L 33/00
[52] U.S. Cl. ................................... 372/46; 372/45; 257/97
[58] Field of Search ........................... 372/45, 46; 257/97

[56] References Cited

U.S. PATENT DOCUMENTS

| | | | |
|---|---|---|---|
| 4,780,879 | 10/1988 | Chinone et al. | 372/46 |
| 5,394,425 | 2/1995 | Fukunaga et al. | 372/46 |
| 5,764,674 | 6/1998 | Hibbs-Brenner et al. | 372/46 |
| 5,804,461 | 9/1998 | Beyea et al. | 438/45 |

*Primary Examiner*—Rodney Bovernick
*Assistant Examiner*—Quyen P. Leung
*Attorney, Agent, or Firm*—Thomas P. Grodt

[57] ABSTRACT

A semiconductor laser device is disclosed in which the device comprises one or more ion-implanted regions as a means to decrease the occurrence of device failures attributable to dark-line defects. The ion-implanted regions, which are formed between the laser gain cavity and the regions of probable dark-line defect origination, serve to modify the electrical, optical, and mechanical properties of the device lattice structure, thus reducing or eliminating the propagation of dark-line defects emanating from constituent defects or bulk material imperfections which may be present in the device.

13 Claims, 4 Drawing Sheets

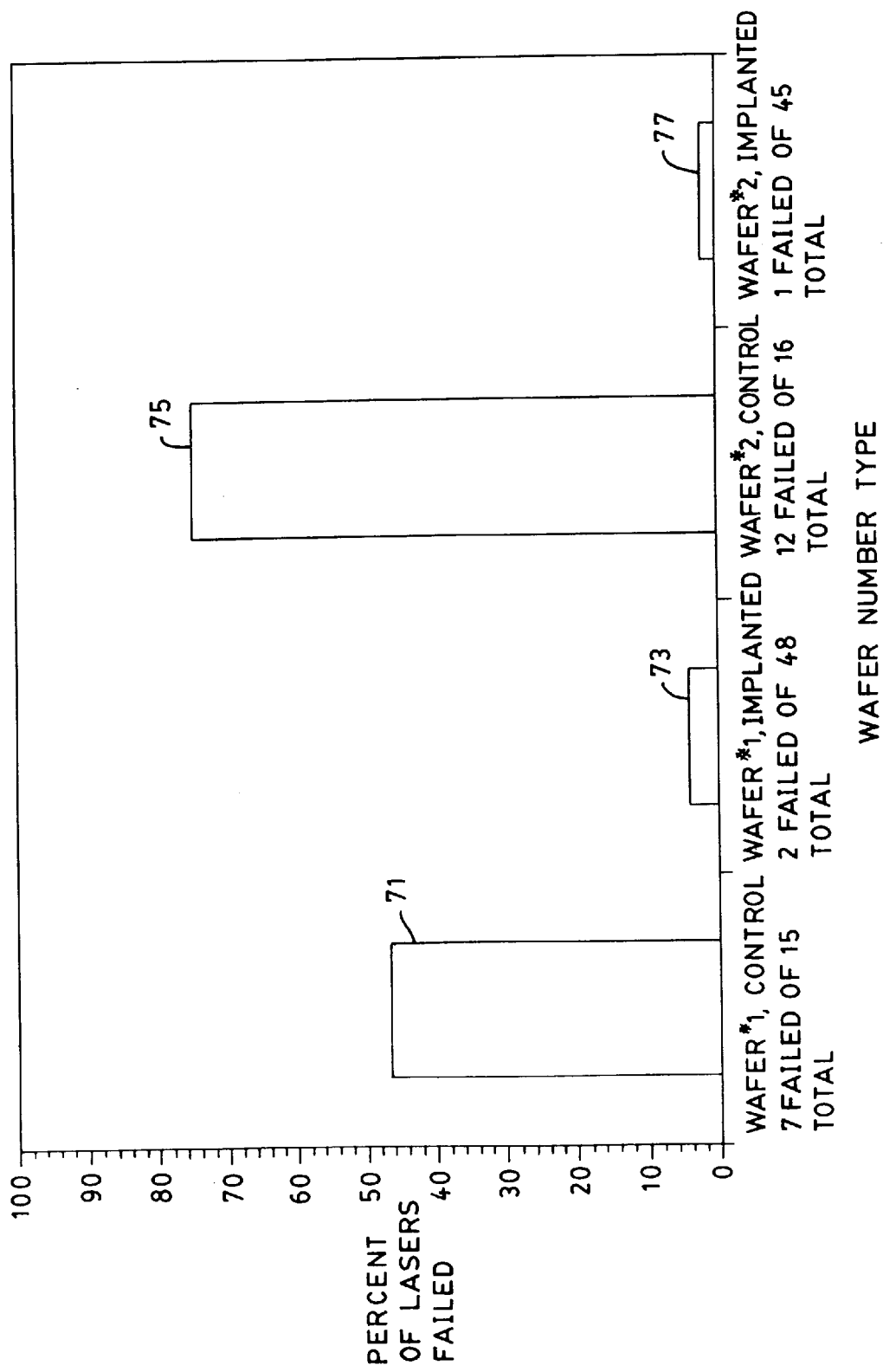

LASER DIODE WITH AN ION-IMPLANTED REGION

This is a continuation of application Ser. No. 08/561,054 filed Nov. 22, 1995, now U.S. Pat. No. 5,804,461.

FIELD OF THE INVENTION

This invention relates to the fabrication of semiconductor devices, primarily optical radiation generating devices such as laser diodes, and more particularly, to a fabrication method which includes ion implantation as a means to decrease the occurrence of device failures attributable to dark-line defects.

BACKGROUND OF THE INVENTION

Many types of electronic systems incorporate active optical devices such as laser diodes. Because they are active devices, laser diodes are prone to eventual failure. Quality control methods, such as an initial "burn-in" procedure, serve to screen out many defective laser devices. Those devices passing quality control standards are normally expected to meet a specified mean-time-to-failure operational lifetime. However, in the present art, there continue to be certain types of laser diode failures which conventional quality control screening measures are inadequate to detect.

One such type of laser diode failure has been identified and studied by the applicants. It was found that a statistically significant portion of lasers which had passed the burn-in procedure subsequently degraded in a small fraction of the expected mean-time-to-failure operational lifetime. When this problem was investigated, it appeared that the primary cause of the unexpected laser degradation was related to the presence of dark-line defects (DLDs) within the failed devices.

The phenomenon of DLDs is well-known in the relevant art. This, and various other types of laser failure modes are discussed in the referenced technical paper entitled, "Degradation of III-V Opto-Electronic Devices" by O. Ueda. In one of the failure modes, referred to as a "rapid degradation" mode, the laser device characteristically forms nonradiative regions, or DLDs, and exhibits a rapid decrease of output power. The paper attributes the formation of a DLD to a recombination-enhanced process, involving excess minority carriers, occurring at a lattice defect or dislocation present within the opto-electronic device.

At least two solutions for obtaining rapid-degradation-free devices are described in the paper by Ueda. One solution calls for chemically treating the device substrate, prior to growth of the device, so as to eliminate growth-induced lattice defects. Additional fabrication steps would be incurred with this approach. Another solution is directed to the achievement of good lattice matching and aims for the reduction of stress introduced during fabrication.

The reduction of stress in conjunction with the elimination of DLDs is also described in U.S. Pat. No. 5,173,447 issued to Ijichi et al. This reference states that a DLD may result from a condition in which the laser active layer receives a compressive stress from the substrate. In one embodiment of the invention, a stress-relieving layer is interposed between the active layer and the upper and lower clad layers. Such additional layers can be added to a laser device by a suitable epitaxial growth method, and also require additional fabrication steps.

Alternatively, Ijichi et. al. '447 teaches that lattice mismatch is reduced by adjusting the composition of upper and lower clad layers such that the relative lattice mismatch rate is less than $10^{-3}$. But this approach, which requires that the cladding layer compositions be changed, may also necessitate changes to the growth parameters of other epitaxial layers. Consequently, neither solution as taught by the reference may be a satisfactory alternative if the device fabrication procedure can not accommodate the additional steps required.

Furthermore, the reduction of lattice mismatch by the methods taught by the references is, for the most part, applicable only to laser devices based on an InGaAs/InGaAsP material system. These methods do not address the problem of DLDs arising in laser devices based on a GaAs/AlGaAs material system.

In a published technical paper entitled, "Diode Laser Degradation Mechanisms: A Review," R. G. Waters attributes laser device degradation processes to interactions occurring between excess minority carriers and lattice dislocations in the device substrate. The paper explains that these excess minority carriers are photogenerated within an operating laser device. Because lattice dislocations are present in most laser devices, such interactions between carriers and lattice can be considered a normal occurrence during lasing operation. One consequence of these interactions appears to be the generation of DLDs. A DLD often originates at a sidewall of the laser device, where a lattice dislocation resulting from a damage site is likely to reside, and propagates toward the active region, that portion of the active layer underlying an active stripe, whereupon sudden failure of the device inevitably results.

Damage sites are inherent at laser sidewalls when mechanical scribing and/or breaking is performed during the fabrication process. Laser sidewalls are commonly delineated by a scribing procedure to enable subsequent mechanical separation of adjoining devices. DLDs appear to arise from the recombination of photogenerated carriers at these damage sites. Another source of DLDs appears to be bulk defects which may be present in the substrate material used for fabrication of the laser device. But because improved growth techniques have reduced the number of such bulk defects, the proportion of DLDs resulting from bulk defects is usually smaller than the DLDs resulting from damage sites.

Two corrective methods are indicated in the Waters paper. The first method demonstrates that an etching procedure, rather than mechanical scribing, can be used to isolate or separate the individual laser devices during fabrication. A chemical etch may not produce the same type of microscopic damage sites as those produced by mechanical scribing. A chemical etching procedure is one method of avoiding mechanically-induced constituent dislocations, and the use of a chemical etch may serve to eliminate the initiation of certain types of DLDs. However, the addition of an etching operation undesirably increases the complexity of device fabrication.

The paper demonstrates that the laser sidewall edges can be displaced from the laser active region as an alternative corrective method. It has been shown that the propagation velocity of DLDs originating at a sidewall edge is reduced when the distance is increased between a laser sidewall edge and the active region. This reduction in propagation velocity is presumed to be a consequence of the smaller power density present in the semiconductor material at the increased distance from the active region.

This power density results from the effects of both the electrical current used to power the laser device and the device-generated radiation in the waveguide. It is well-known in the art that an increase in power density will increase the likelihood of DLD formation and velocity of propagation in a laser device. By displacing the laser sidewall, where damage sites are likely to be found, the damage sites are shifted to a region of lower power density and the initiation of DLDs may thereby be lessened. However, the method of sidewall displacement is not a suitable solution when constraints have been imposed on the external physical dimensions of the laser device.

Further, this method of sidewall displacement has been evaluated by the applicants who found that the method did not prevent the formation of DLDs, but that it merely increased the period of time elapsing before a DLD propagated into the laser active region and caused the device to fail. The lifetime of a defective laser was thereby extended beyond the period of time within which such a device was normally expected to fail if a DLD was present. The effectiveness of burn-in screening procedures was consequently diminished.

While the present state of the art recognizes that certain DLDs may be generated by the presence of lattice defects or stress within the laser device, the preventive measures suggested by the prior art are not suitable for all types of device configurations or fabrication methods, as explained above. Clearly, there remains a need to provide an alternative means of protection by which failures resulting from the growth of DLDs can be avoided or minimized for screened laser devices. It is therefore an object of the present invention to provide a preventative fabrication method for semiconductor devices, primarily optical radiation generating devices such as laser diodes, by which the potential occurrence of DLDs, whether attributable to constituent dislocations or stress sites in an operating device, is decreased or eliminated.

It is another object of the invention to provide such a method which allows for the mechanical separation of adjoining devices during fabrication.

It is another object of the invention to provide such a method which does not require changing the chemical constituents of the device so as to decrease or eliminate the formation of DLDs.

It is a further object of the invention to provide a laser device having a reduced probability of incurring failure due to a dark-line defect, in which the device external dimensions remain unchanged from an equivalent conventional laser device.

It is yet another object of the invention to provide such a device having the same transverse configuration of epitaxial layers as an equivalent laser device having no means for preventing failures related to dark-line defects.

Other objects of the invention will, in part, appear hereinafter and will, in part, be apparent when the following detailed description is read in connection with the drawings.

BRIEF DESCRIPTION OF THE DRAWINGS

The objects and features of the present invention will become more apparent from the consideration of the general description given above and the detailed description of the preferred embodiments given below, taken in conjunction with the accompanying drawings in which:

FIG. 4 is a bar graph showing that the failure rate during a burn-in test cycle is less for ion-implanted laser devices than for non-implanted devices; and, FIG. 5 is a graph illustrating the percentage of laser device failures occurring as a function of operating lifetime, both for ion-implanted and non-implanted laser devices.

SUMMARY OF THE INVENTION

The present invention results from the observation that implanting ions into a region of an optical radiation-generating device, such as a laser diode, serves to eliminate the generation and subsequent growth of dark-line defects emanating from constituent dislocations in the region. Constituent dislocations are inherent lattice defects which may be present in the substrate crystal as a result of the growth or processing of the bulk material. The lattice defects may have also been induced by fabrication steps related to the growth of the epitaxial layer or by handling operations related to wafer processing and mechanical separation, including device packaging and optical coating processes. Ion implantation provides a method of modifying a region within the device so as to advantageously restrict or confine the propagation of electrical current or radiation within the modified region. By forming the modified region between an active region, such as the gain cavity of a laser, and a region of probable lattice defects, such as the lateral side of the laser, DLD growth into the active region is effectively eliminated.

The method includes an implantation operation by which ions are implanted into some of the semiconductor layers, including the active layers, of the laser structure. The regions selected to receive ion implantation are delineated by a patterned protective mask of photoresist, metal, or other implantation energy dispersive material deposited on the device epitaxial surface prior to exposure of the device to the ion flux. The energy of the implantation ions are controlled so as to produce a desired depth of implantation for a particular laser structure. The ion-implantation operation can be performed at any appropriate stage of device or wafer processing, provided there is no subsequent processing operation requiring a temperature greater than 450° C.

DETAILED DESCRIPTION OF THE INVENTION

Figure 1:
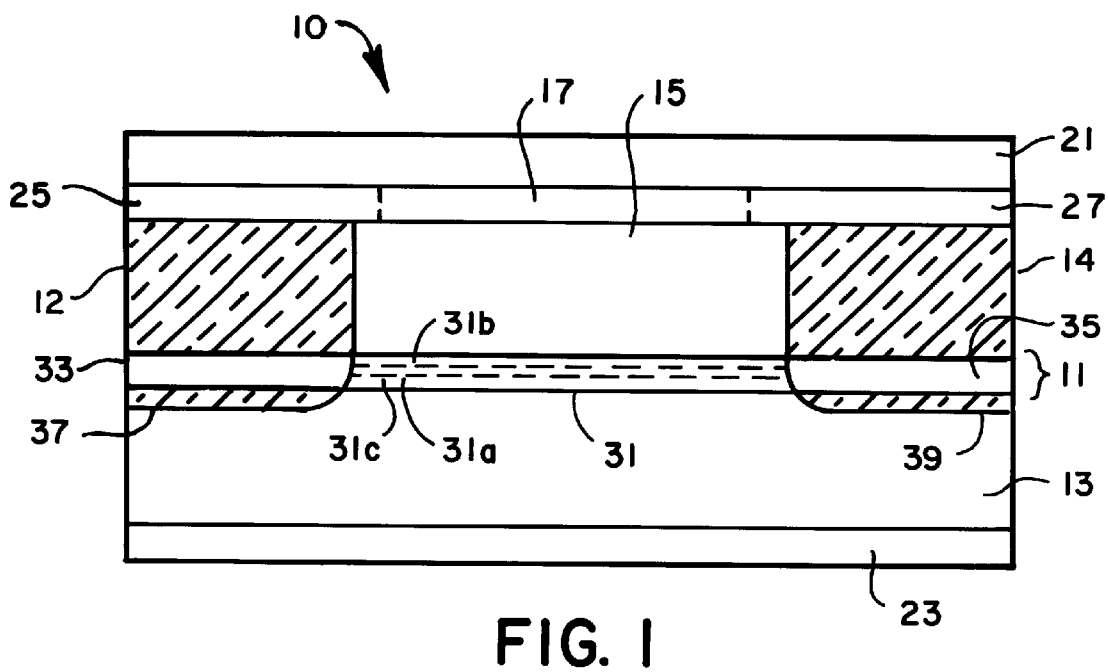
FIG. 1 is a simplified diagrammatical view of one longitudinal face of a laser device, fabricated in accordance with the inventive method, showing the transverse arrangement of semiconductor layers and having ion-implanted regions, denoted by cross-hatching, adjacent to the lateral sides of the device.

FIG. 1 is a simplified diagrammatical view of one longitudinal face of a proton-isolated stripe laser 10 fabricated in accordance with the inventive method. Although a gainguided laser is shown, the disclosure which follows can be applied as well to other laser configurations, such as an index-guided laser. Laser 10, which can be formed by epitaxial deposition in the vertical (i.e., transverse) direction, comprises an active layer 11 overlying a lower cladding 13. An upper cladding 15 is disposed upon active layer 11. Active layer 11 functions as a waveguide when structured as shown. Alternatively, active layer 11 can be composed of a waveguiding region 31a transversely bounded by layers 31b and 31c having indices of refraction different from that of waveguiding region 31a. A cap 17, which is highly electrically-conductive, is disposed upon upper cladding 15. Power is supplied to laser 10 by means of electrical current provided between a metallized upper electrode 21 and a metallized substrate 23. The inventive features of laser 10 can be best described with reference to both FIGS. 1 and 2.

Figure 2:
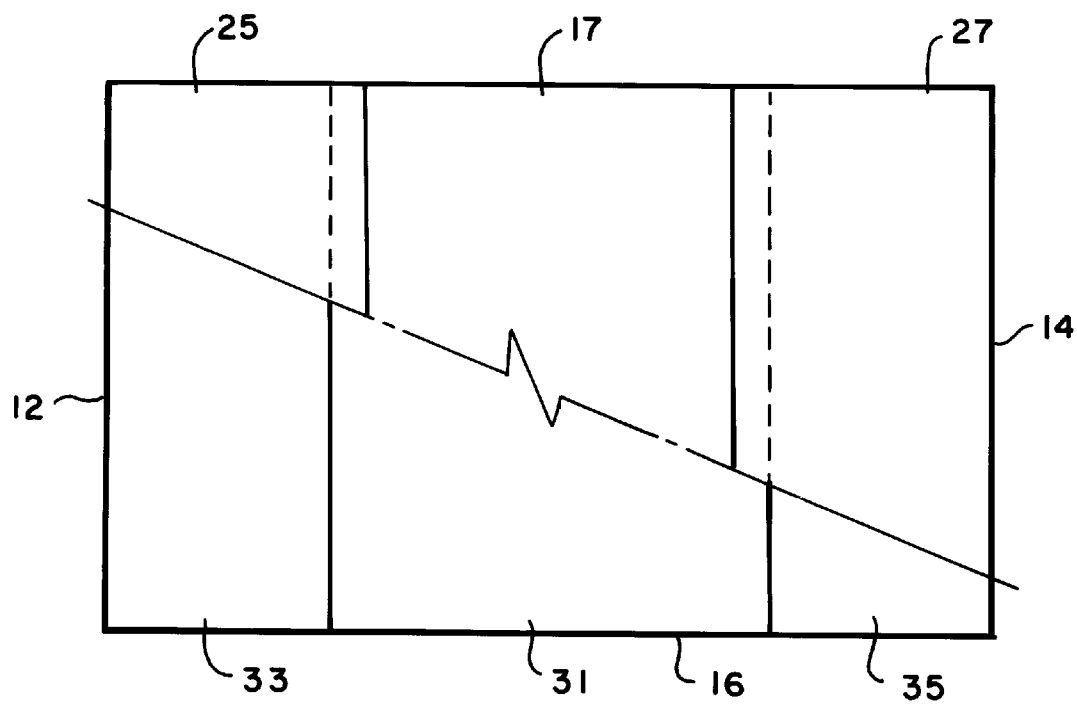
FIG. 2 is a diagrammatical top view of the device in FIG. 1 in which the top layer has been omitted from the upper portion of the figure and the top three layers have been omitted from the lower portion.

FIG. 2 is a simplified diagrammatical top view of laser 10 with upper electrode 21 removed, and with cap 17 and upper cladding layer 15 also removed in the lower part of the illustration. Cap 17 includes isolation regions 25 and 27, both of which can be produced by proton-implantation methods as is well known in the art. Isolation regions 25 and 27 are formed along lateral sides 12 and 14 of laser 10 and serve to direct the flow of electrical current through a central portion of active layer 11. Lasing action is thus largely confined to this central portion which includes an active region, such as gain cavity 31. Optical radiation is emitted at a facet 16.

Active layer 11 also comprises semi-insulating regions 33 and 35, which are formed as a result of ion implantation into part of active layer 11 by a process explained in greater detail below. In the example provided, modified regions 37 and 39, which extend through upper cladding layer 15 and active layer 11, and into lower cladding 13, have been produced by ion implantation. Modified regions 37 and 39 are disposed between gain cavity 31 and both lateral sides 12 and 14 of laser 10 to decrease the probability that laser 10 will fail as a result of a dark-line defect originating at one of these sides. Within modified regions 37 and 39, the propagation of electrical current and radiation is restricted or confined because characteristic properties of the modified regions have been changed from corresponding characteristic properties of laser 10 as a result of the ion implantation. The implantation process changes electrical properties by doping, chemical properties by introducing ionic species, mechanical properties by locally altering the lattice structure, and optical properties by decreasing radiation-confining capabilities. In particular, the implantation of ions into regions of active layer 11 has both an electrical effect and an optical effect. Ion implantation reduces the conductive characteristic of the affected regions and also effectively eliminates the ability of these regions to confine radiation and act as waveguides.

Figure 3A:
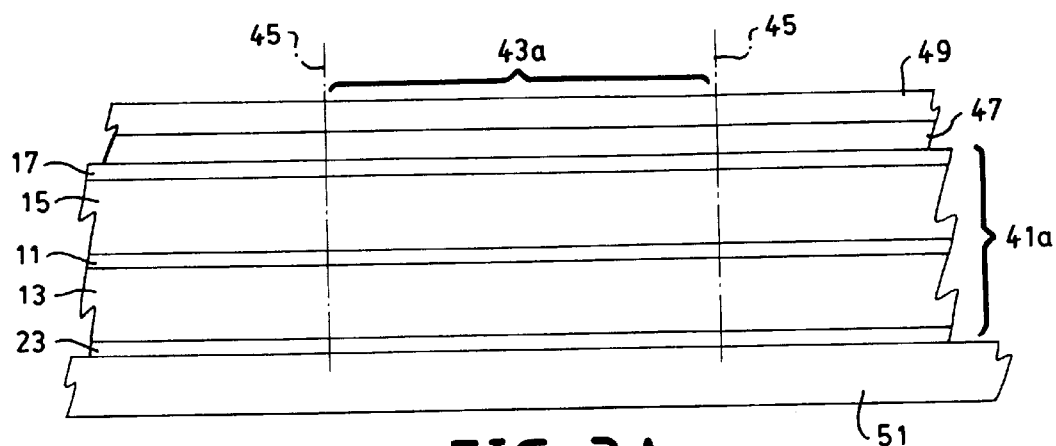
FIG. 3A is a diagrammatical cross-sectional view of a semiconductor wafer segment having a partially-fabricated laser device upon which two layers of photoresist have been applied as an initial step in preparation for ion implantation according to the inventive method.
Figure 3B:
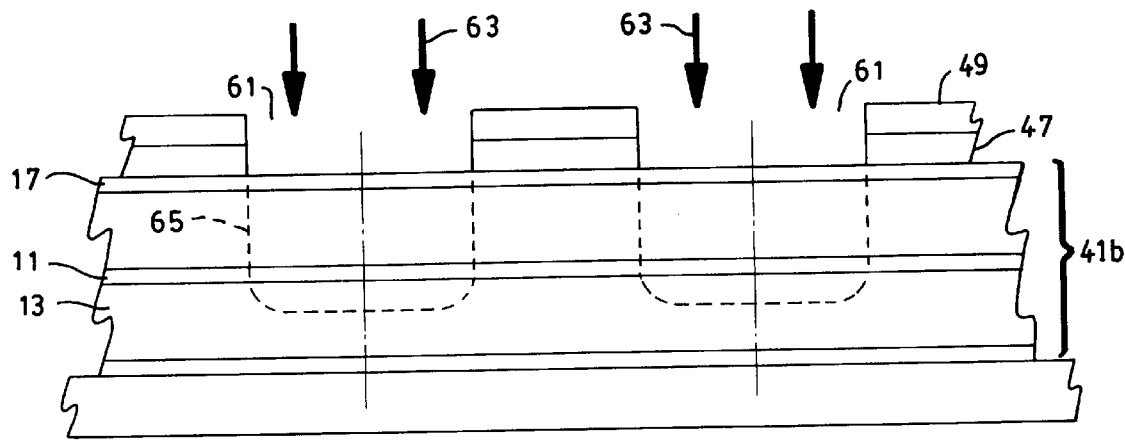
FIG. 3B is a diagrammatical view of the wafer segment of FIG. 3A during a subsequent fabrication step in which an ion flux is being applied to the device in regions from which exposed photoresist has been removed.

The ion-implantation method used to produce modified regions 37 and 39 in laser 10 can best be described with reference to FIGS. 3A through 3C. FIG. 3A provides a diagrammatical cross-sectional view of a wafer segment containing a semiconductor array 41a, which includes a plurality of adjoining partially-fabricated devices 43a. Array 41a is generally a two-dimensional array of laser devices 43a comprising either an entire wafer or a wafer portion, but the ion-implantation process described herein can be performed on a single linear array, or on a single device as appropriate.

At a subsequent stage of fabrication, devices 43a will be separated at interface planes 45, to form lateral sides, after semiconductor array 41a has been first separated into individual linear arrays and facet coated as described below. In the example provided, partially-fabricated device 43a includes metallized substrate 23, lower cladding 13, active layer 11, upper cladding 15, and cap 17. However, the ion-implantation method according to the invention is not limited to this stage of device fabrication and can be performed at any appropriate stage of device or wafer processing, provided there is no subsequent processing operation requiring a temperature greater than approximately 450° C. Subjecting an ion-implanted device to a temperature over 450° C. will initiate annealing and begin to undo the modifications made by the implantation process.

The regions in array 41a selected to receive ions by implantation are delineated by means of the pattern formed by a protective mask of photoresist, metal, or other implantation energy dispersive material deposited on the surface of array 41a prior to exposure of device 43a to the ion flux. The deposited pattern is usually a set of parallel stripes, each stripe aligned with and centered on a corresponding device 43a, leaving the regions lying at the boundaries between adjacent devices free of material so as to allow ion implantation.

To aid in handling during processing, array 41a is secured to a 2-inch silicon wafer 51 using Crystalbond™ or an equivalent adhesive. A first photoresist layer 47, approximately 2.5 $\mu$m in thickness, is applied to the surface of array 41a and subjected to a softbake. A similar, second photoresist layer 49 is then applied over first photoresist layer 47. Photoresist layers 47 and 49 are exposed and the exposed portions are removed to produce channels 61 as shown in FIG. 3B. The optimal width of the channels 61 is determined by taking into account the size of modified regions desired for dealing with dark-line defects and the limitation on modified region size imposed by the cross-sectional geometry of the devices being ion-implanted. Relatively large modified regions will provide proportionately greater protection against device failure, but too large a modified region will adversely affect the operation of an adjacent active region. In one embodiment, 285 $\mu$m wide photoresist channels were formed on an array of laser devices 500 $\mu$m in width. After separation, each laser device had sidewall modified regions approximately 140 $\mu$m wide and a gain cavity approximately 215 $\mu$m in width. Gain cavity operation was not affected by the presence of the modified regions and laser devices having the sidewall modified regions met the performance specifications of unmodified laser devices. Moreover, the reliability of the modified devices exceeded the reliability of the unmodified devices.

The depth to which an ion-implantated region 65 extends is determined by the energy of the ions comprising an ion flux 63. In the example provided, ion-implantated region 65 is shown extending into lower cladding 13, but a greater or a lesser depth can be produced as desired. For example, for a device configuration in which an ion-implantated portion borders on a longitudinal facet (e.g., facet 16 shown in FIG. 2), the depth of ion implantation is decreased so that the resultant modified portion does not affect the proper functioning of the underlying gain cavity. This can be achieved by decreasing ion energy so that ion implantation does not extend into active layer 11. Ion flux 63 is maintained so as to produce a density of implanted ions sufficiently large to change characteristic properties of the material being implanted.

A laser device typically includes a relatively thin undoped active layer lying between thicker cladding layers which have been doped either p- or n-type. In a preferred embodiment of the disclosed process, the depth of ion implantation is selected so as to modify the conductivity of the active layer adjacent the device sidewalls. As the process of ion implantation proceeds, the conductivity of the affected region of the active layer is reduced, from semiconductive to semi-insulating. A similar effect is produced in the cladding layers immediately above and below the active layer. This occurs because the ions comprising the ion flux penetrate the material over a range of depths, where the range is greater than the thickness of the active layer, and not all ions become implanted within the active layer. The reference article, "Isolation of Junction Devices in GaAs Using Proton Bombardment," by Foyt et al., provides a good discussion of the use of proton bombardment to convert both p-and n-type GaAs into high resistivity material and provides some examples of resulting carrier concentrations as a function of implantation depth.

As an illustration of the inventive process, hydrogen ion (i.e., proton) flux parameters will be derived for a GaAs laser having an upper cladding of thickness 2.0 $\mu$m and an active layer of thickness 0.1 $\mu$m. A mean implantation depth of 2.5 $\mu$m is selected so as to provide for ion passage through the upper cladding and the photoresist layers. The ion energy corresponding to a particular implantation depth can be found from a tabulated reference, such as "Projected Range Statistics," by Gibbons et al. in which is provided implantation depth data (i.e., range and deviation values derived by a numerical method procedure) for various combinations of substrate materials and implantation ions having energies ranging from 1 KeV to 1 MeV. Based upon such tabulated data, ions having a mean energy level of 320 KeV will produce an implantation depth of approximately 2.60 $\mu$m in germanium. A 320 KeV ion flux will also produce a similar implantation depth in GaAs.

The ion density required to change an implanted active layer region from semiconducting to semi-insulating has been determined to be approximately $10^{19}$ cm$^{-3}$ or greater. The hydrogen ion flux required to produce this ion density at an implantation depth of 2.5±0.5 $\mu$m is found to be about $2.0 \times 10^{15}$ cm$^{-2}$ from the relationship, $$n(R_p) = 0.4\left[\frac{\phi}{\Delta R_p}\right]$$

where n($R_p$) is the concentration of implanted ions at a projected range $R_p$, $\phi$ is the ion flux, and $\Delta R_p$ is the standard deviation or "straggle" of the ion distribution. Derivation of the above relationship can be found in the referenced text "VLSI Technology," ed. S. M. Sze, at pp. 224–5.

Satisfactory results were obtained when this hydrogen ion flux was maintained for approximately three minutes. Mechanically-separated laser devices modified in accordance with this ion flux exhibited a marked improvement in the percentage of devices which passed a burn-in test cycle, and had a lower mean degradation rate than did similar unmodified laser devices. It was also found that these devices had a greater probability of surviving an aging test cycle than did comparable non-implanted laser devices. The bar graph shown in FIG. 4 summarizes the results of testing conducted on four groups of laser diodes obtained from two processed wafers, Wafer #1 and Wafer #2. All four groups of diodes were fabricated in accordance with conventional methods and had not been proton implanted.

A first group of fifteen laser diodes from Wafer #1 were then subjected to the aging test cycle at which the laser diodes were operated for 500 hours at an output power level of approximately 500 milliwatts. This resulted in seven failed diodes, or a failure rate of about 47% for the non-implanted diodes as indicated by bar 71. A second group of forty eight laser diodes from Wafer #1 were proton implanted along their lateral edges in accordance with the procedure described above before being subjected to the same aging cycle as the first group. The forty eight diodes produced only two failures, yielding a failure rate of 4.2% for the proton-implanted diodes as indicated by bar 73. Both failures occurred as a result of defects originating in the diode active regions. The second group of proton-implanted laser diodes thus had a lower failure rate after completion of the 500-hour aging cycle than did the first group of non-implanted diodes.

A second aging cycle was repeated on third and fourth groups of laser diodes obtained from Wafer #2. The third group consisted of sixteen non-implanted laser diodes, and the fourth group consisted of forty-five diodes which had also been subjected to proton implantation. Of the sixteen non-implanted diodes in the first group, twelve failed during the aging cycle for a failure rate of about 75% as indicated by bar 75. Proton implantation lowered the failure rate in the second test cycle as well. Of the forty-five laser diodes which were proton-implanted prior to aging, only one diode failed. The cause of failure was attributed to a bulk defect lying in the active region. As indicated by bar 77, the failure rate was only 2.2%. Further, a lower degradation rate was realized by the proton-implanted diodes. Failure analysis was performed on many of the failed devices. Results indicated that for proton-implanted devices, none of the failures were attributable to dark-line defects initiating at the edge of the laser diodes. For the non-implanted diodes, all of the failures were caused by dark-line defects initiating at the edge of the laser diode.

Figure 5:
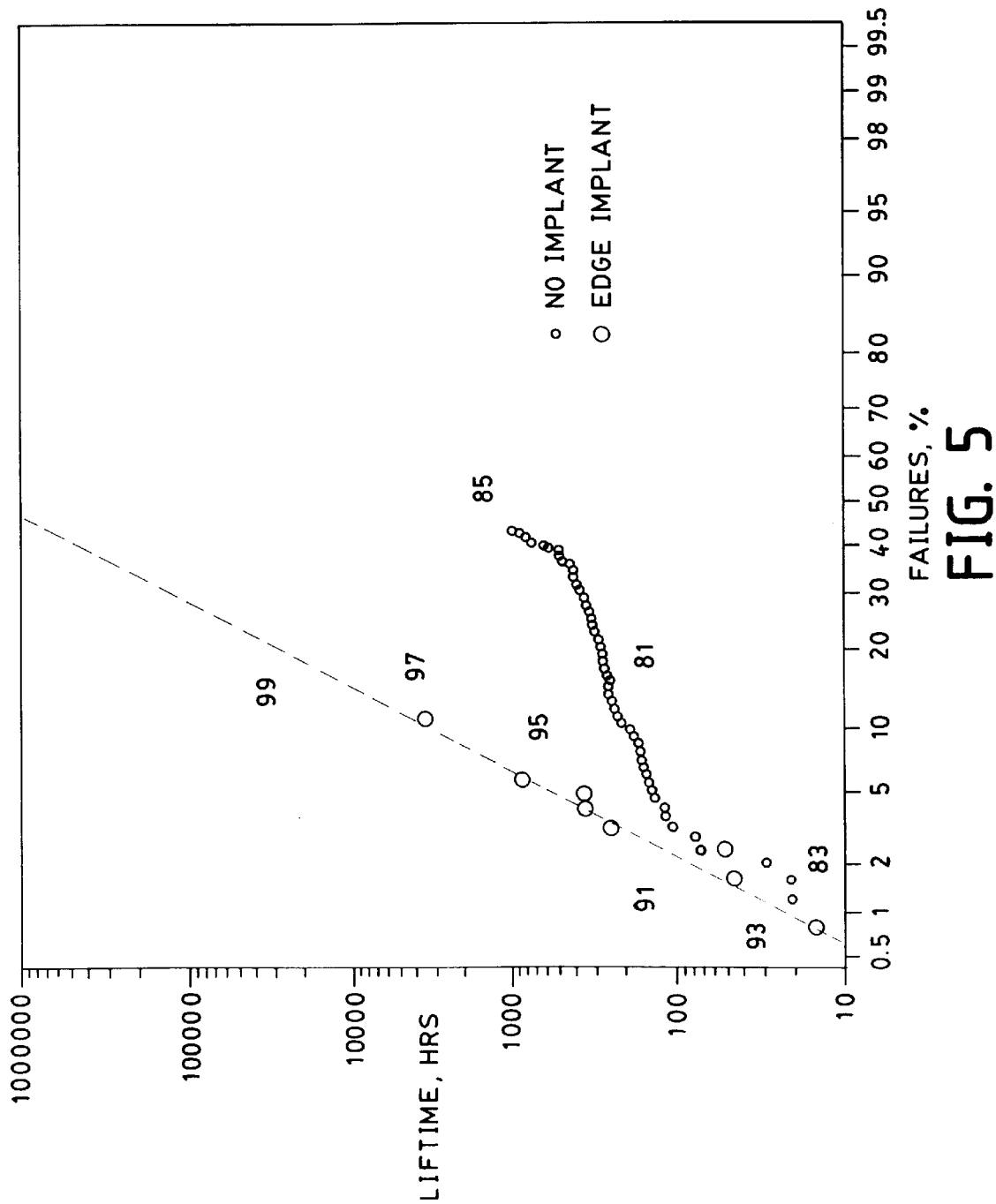

Another reliability comparison between proton-implanted and non-implanted diodes is provided by the graph of FIG. 5. A control group of 247 non-implanted laser diodes was subjected to a reliability test cycle in which the laser diodes were operated at an output power level of 500 milliwatts. The reliability test cycle was conducted for a period of 1000 hours and produced 106 failures. The results are provided by curve 81 which consists of 106 data points, each data point representing one failed diode occurring at a particular lifetime, given in hours. For example, the first diode to fail had a lifetime of approximately 20 hours, as indicated by datum point 83, and the last diode to fail had a lifetime of approximately 1000 hours, as indicated by datum point 85. The results of this test cycle predicted a mean-time-to-failure of about $10^3$ hours for the non-implanted diodes.

The reliability test cycle was repeated for 125 laser diodes which had been proton-implanted along their lateral edges in accordance with the procedure described above. Failure datum points for these proton-implanted diodes are plotted along curve 91. For example, the first proton-implanted diode to fail had a lifetime of less than twenty hours, as indicated by datum point 93. Six additional failures occurred within the first 1000 hours of testing, with the seventh failure indicated by datum point 95. Testing was continued for another 2500 hours with no additional failures occurring. Final datum point 97, at 3500 hours, represents the cessation of testing and does not indicate a failed diode. By extrapolating curve 91 into curve 99, a mean-time-to-failure figure of approximately $10^6$ hours was predicted for the proton-implanted laser diodes undergoing the reliability test cycle described.

After the ion-implantation procedure, photoresist layers 47 and 49 are stripped from array 41b and those manufacturing operations remaining can be completed. In an alternative embodiment, an ion-implantation process using other cations or anions is used to produce a similar change in the electrical, chemical, mechanical, and optical properties of the ion-implanted regions. For example, a doubly-ionized oxygen ($O^{2+}$) implantation process which does not require a thermal annealing step, can be used to produce ion-implanted regions. The inventive method can also be practiced by implanting silicon ($Si^+$) or carbon ($C^+$) ions. The use of larger ions is, however, less preferable because of the greater difficulty encountered in achieving a sufficient implantation depth.

Figure 3C:
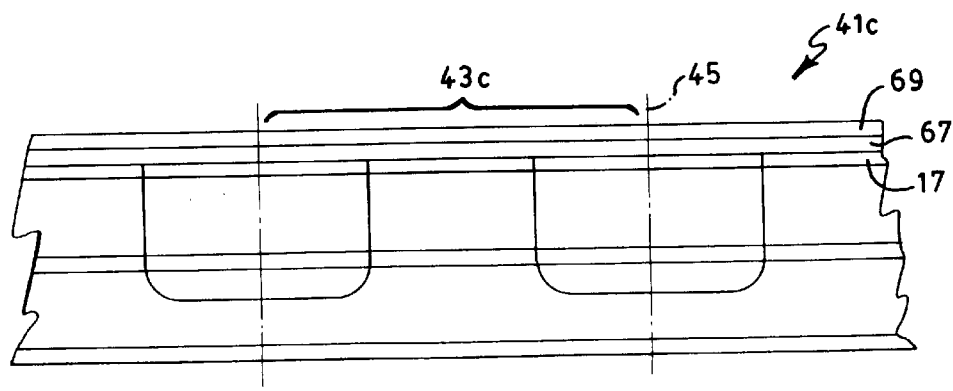
FIG. 3C is a diagrammatical view of the device in FIG. 3B in which ion implantation has been completed and two protective layers have been deposited onto the upper surface of the device after the layers of photoresist have been removed.

After all photoresist has been removed, protective cap 17 can be overlaid by a first conductive layer 67, comprised of Ti/Pt/Au metal, and a second conductive layer 69, comprised of Ti/Au metal, as shown in FIG. 3C. In a preferred embodiment, protective layers 67 and 69 are approximately 0.17 μm and 0.2 μm in thickness, respectively. Alternatively, first conductive layer 67 can be applied prior to the ion-implantation procedure described above.

Semiconductor array 41b is formed into a plurality of linear arrays 41c by a standard process of scribing and separating adjoining linear arrays along separation planes lying perpendicular to interface planes 45. Facet coating is performed on the longitudinal faces of the resulting linear arrays 41c by using a standard procedure. Subsequent mechanical separation of linear array 41c into individual devices 43c is accomplished by mechanical scribing and chipping along lateral separation planes 45.

The method of ion implantation described above can also be adapted for use in semiconductor devices having different component-layer geometries. For device configurations in which the number or the thicknesses of component layers differ from the embodiment disclosed above, the depth of ion implantation is adjusted accordingly by using hydrogen ions, or other ions, of different kinetic energies. The depth of ion implantation is decreased by using less energetic hydrogen ions, or by using ions having a greater atomic weight. For example, Gibbons et al. give projected ranges in GaAs of 0.64 μm, 0.49 μm, and 0.28 μm for 320 KeV carbon, oxygen, and silicon ions respectively. Conversely, ions of higher kinetic energies can be used to create modified regions of greater depth. Foyt et al., at p. 211, indicate that proton penetration into GaAs is about one micron for every 100 KeV of proton energy.

The above-described methods of ion implantation can also be applied to other devices, including passive devices which do not include an active layer but are nevertheless subjected to incident optical radiation when placed into service. The presence of one or more ion-implanted regions can serve to increase the mean operating lifetime of such devices by decreasing or preventing the alteration of material structure from the incident radiation.

The present invention is advantageously adapted to eliminate the generation and subsequent growth of dark-line defects emanating from constituent lattice defects or from bulk material imperfections. While there have been described preferred embodiments of the present invention, it will be readily apparent to those skilled in the art that various changes and modifications may be made therein without departing from the invention, and it is intended in the wording of the appended claims to include such changes and modifications as would be encompassed by the true spirit and scope of the invention.

What is claimed is:

1. A semiconductor optical radiation generating device comprising:

an active layer;

at least one cladding layer adjacent said active layer, said cladding layer extending between a first lateral side and a second lateral side of said semiconductor device, said cladding layer further structured and arranged such that said active layer functions as a waveguide for the optical radiation;

a cap layer comprising an isolation region, said isolation region extending from said first lateral side, said isolation region structured and arranged to direct the flow of electrical current through a central portion of said active layer to form an active region, said active region operating to emit the optical radiation when subjected to an electric field resulting from the electrical current; and, a modified region in said cladding layer, said modified region comprising implanted ions such that the characteristic properties of said modified region are changed from corresponding characteristics of said cladding layer, said modified region extending from said first lateral side, the extent of said modified region from said first lateral side comprising a smaller dimension than the extent of said isolation region from said first lateral side, such that the operation of said active region is not adversely affected by said modified region, said modified region serving to reduce the growth, into said active region, of dark-line defects emanating from constituent lattice defects which may be present in said semiconductor device, whereby the probability of failure attributable to dark-line defects is decreased for said semiconductor device.

2. The semiconductor device of claim 1 wherein said active layer further comprises a semi-insulating region, said semi-insulating region comprising implanted ions such that electrical conductivity of said semi-insulating region is reduced from the electrical conductivity of said active layer, said semi-insulating region extending from said first lateral side, the extent of said semi-insulating region from said first lateral side comprising a smaller dimension than the extent of said isolation region from said first lateral side.

3. The semiconductor device of claim 1 further comprising a second cladding layer extending between said first and second lateral sides, said second cladding layer comprising a modified region comprising implanted ions such that characteristic properties of said second cladding layer modified region are changed from corresponding characteristic properties of said second cladding layer, said second cladding layer modified region extending from said first lateral side, the extent of said second cladding layer modified region from said first lateral side comprising a smaller dimension than the extent of said isolation region from said first lateral side.

4. A semiconductor laser device, comprising:

first and second lateral sides;

a lower cladding layer extending between said lateral sides;

an active layer overlying said lower cladding layer, said active layer comprising a gain cavity;

an upper cladding layer overlying said active layer and extending between said lateral sides;

a cap layer comprising at least one isolation region extending from said first lateral side, said isolation region structured and arranged, so as to direct the flow of electrical current through a central portion of said active layer to form said gain cavity, said gain cavity operating to emit the optical radiation when subjected to an electric field resulting from the electrical current, and;

at least one modified region extending through said upper cladding layer and said active layer, said modified region comprising implanted ions such that characteristic properties of said modified region are changed from corresponding characteristic properties of said cladding layer and said active layer, said modified region further extending from said first lateral side, the extent of said modified region from said first lateral side comprising a smaller dimension than the extent of said isolation region from said first lateral side such that the operation of said gain cavity is not adversely affected by said modified region, said modified region serving to reduce the growth, into said gain cavity, of dark-line defects emanating from lattice defects which may be present in said laser device, whereby the probability of failure attributable to dark-line defects is decreased for said laser device.

5. The semiconductor laser device of claim 4 wherein said lateral sides are approximately 500 µm apart.

6. The semiconductor laser device of claim 4 wherein said at least one modified region is approximately 140 µm in length.

7. The semiconductor laser of claim 4 further comprising at least one protective layer overlying said cap layer.

8. The semiconductor laser device of claim 7 wherein said protective layer comprises Ti/Pt/Au metal.

9. The semiconductor device of claim 4 wherein said implanted ions comprise hydrogen ($H^+$) ions.

10. The semiconductor device of claim 4 wherein said implanted ions comprise carbon ($C^+$) ions.

11. The semiconductor device of claim 4 wherein said implanted ions comprise doubly-ionized oxygen ($O^{2+}$) ions.

12. The semiconductor device of claim 4 wherein said implanted ions comprise silicon ($Si^+$) ions.

13. The semiconductor laser device of claim 4 further comprising at least one modified portion within said upper cladding layer, said upper cladding layer modified portion extending from a longitudinal facet of said laser device, said upper cladding layer modified portion comprising implanted ions such that characteristic properties of said upper cladding layer modified portion are changed from corresponding characteristic properties of said upper cladding layer.

* * * * *